United States Patent [19]

Lee

[11] Patent Number: 5,105,148
[45] Date of Patent: Apr. 14, 1992

[54] REPLACEABLE TIP TEST PROBE

[75] Inventor: Jerry L. Lee, South San Gabriel, Calif.

[73] Assignee: ITT Corporation, Secaucus, N.J.

[21] Appl. No.: 645,533

[22] Filed: Jan. 24, 1991

[51] Int. Cl.$^5$ .................... G01R 1/06; H01R 11/18; B23B 31/10
[52] U.S. Cl. .................... 324/158 P; 279/45; 324/72.5; 439/482
[58] Field of Search ............ 324/158 P, 72.5, 158 F, 324/149; 439/482, 863; 279/44, 45, 46, 48

[56] References Cited

U.S. PATENT DOCUMENTS

| 360,426 | 4/1987 | Fray | 279/45 |
| 414,078 | 10/1989 | Rehfuss | 279/46 |
| 975,250 | 11/1910 | Kass . | |
| 1,352,172 | 9/1920 | Brandon . | |
| 2,201,434 | 5/1940 | Gallagher | 294/102 |
| 2,627,147 | 2/1953 | Roach | 51/220 |

FOREIGN PATENT DOCUMENTS 627112  7/1949  United Kingdom ............ 324/72.5

Primary Examiner—Ernest F. Karlsen
Attorney, Agent, or Firm—Thomas L. Peterson

[57] ABSTRACT

An electrical test probe with replaceable tip is provided, which is of low cost and high durability. The probe includes a body (16, FIG. 5) having a chuck-holding recess (26) in its front, with the walls of the recess forming a shoulder at the front and forming an external thread. A probe-holding chuck (52) has a rear portion lying in the body recess; a nut (14) surrounds the front of the chuck and is threadably connected to the body. The chuck is split along an imaginary plane (70) extending at an angle of about 45° from the axis of the probe, into front and rear chuck parts (64, 66). As the nut is tightened to press against the front end of the chuck, the front chuck part (64) slides sidewardly along the split plane so the probe tip (12) is trapped by shear forces between the forward and rearward chuck parts (64, 66).

8 Claims, 3 Drawing Sheets

REPLACEABLE TIP TEST PROBE

BACKGROUND OF THE INVENTION

The most common type of electrical test probe with replaceable tip, has included a chuck with slots in its forward end that form fingers that can grip a probe tip. With the chuck lying in a probe body and a nut tightened on the body, a tapered internal surface of the nut squeezes the fingers together to grip the replaceable tip. Such a test probe has many disadvantages, including the fact that it is expensive to form the slots in the chuck to create the fingers, and the inside of a plastic nut is damaged by burrs at the slots forming the fingers unless the edges of the slots are rounded at further expense. Also, considerable torque is required to tighten the nut to grip the probe tip, with some of the torque merely overcoming the resistance to deflection of the chuck fingers. An electrical test probe with replaceable tip, which was durable and which could be constructed at low cost, would be of considerable value.

SUMMARY OF THE INVENTION

In accordance with one embodiment of the present invention, an electrical test probe with replaceable tip is provided, which is durable and can be constructed at low cost. The probe includes a body having a front end portion with walls forming a chuck-holding recess. The walls of the recess are threaded, and form a largely forwardly-facing shoulder. A chuck has a rear end lying in the recess, a forwardly-opening hole for holding a probe tip, and an abutment that abuts the shoulder of the body. A nut is threadably engaged with the body threads and has a rearwardly-facing shoulder that presses rearwardly against the chuck. The chuck has front and rear parts that are split along an imaginary plane that extends at an angle from the axis of the probe. Thus, when the nut is tightened and pushes rearwardly against the front chuck part, the front chuck part slides sidewardly on the rear chuck part, to trap a probe between them.

The metal front chuck part can be trapped in the plastic nut by forming the front end of front chuck part with an outwardly-extending circular flange that forms a barb. When the front chuck part is forced forwardly into a hole in the nut, the barb is set into the nut and will not fall out. However, the nut can still turn about the front chuck part to enable the nut to be tightened and loosened.

The novel features of the invention are set forth with particularity in the appended claims. The invention will be best understood from the following description when read in conjunction with the accompanying drawings.

DESCRIPTION OF THE PREFERRED EMBODIMENT

Figure 1:
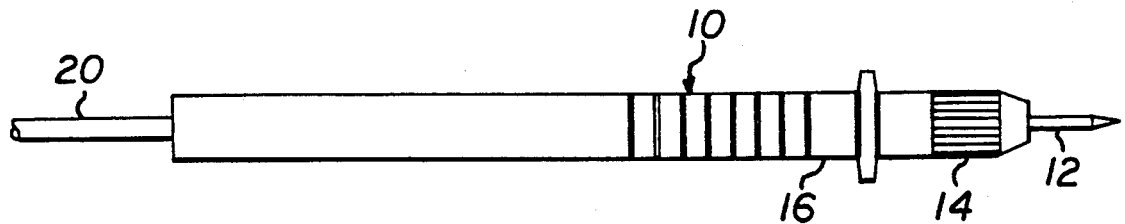
FIG. 1 is a side elevation view of a test probe constructed in accordance with the present invention.

FIG. 1 illustrates a test probe 10 with a replaceable tip 12. The tip can be replaced by partially unscrewing a nut 14 at the front of a body 16 and pulling the tip out in a forward direction F. A new tip can be inserted into the front end of the probe and the nut 14 tightened to securely hold the new tip in place. A wire 20 projects from the rear of the probe and is connected to equipment that can indicate the level of voltage, current, or other parameter sensed by the probe tip.

Figure 2:
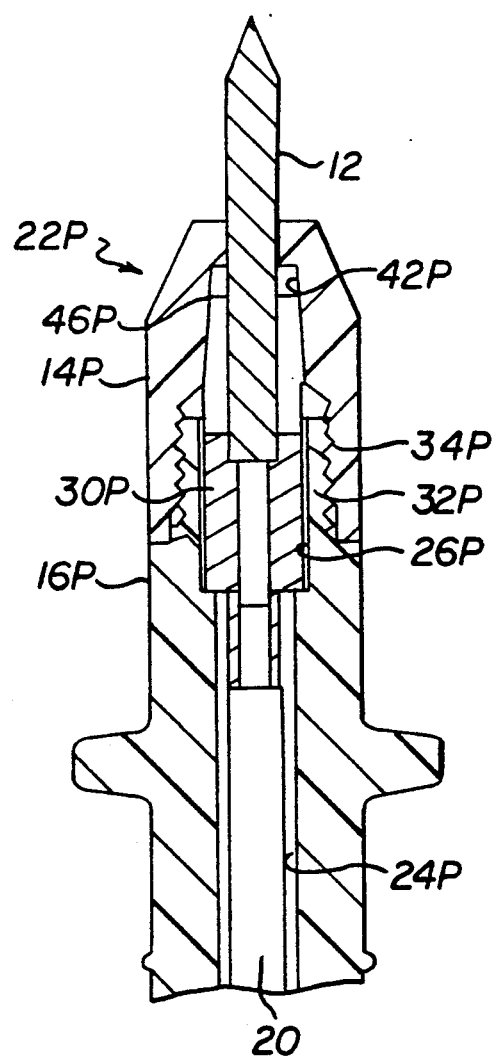
FIG. 2 is a sectional side view of a probe constructed in accordance with the prior art.

FIG. 2 is a sectional view of a prior art test probe 22P. The prior art probe includes a body 16P with a wire-passing hole 24P which passes the wire 20. A front portion of the body has a chuck-holding recess 26P which holds a chuck 30P. The front portion of the body has walls 32P forming part of the recess, and the walls have external threads 34P. A nut 14P has an internally threaded rear end which screws onto the body threads 34P.

Figure 4:
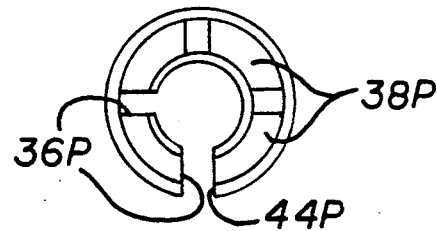
FIG. 4 is a front elevation view of the prior art chuck of FIG. 3.
Figure 3:
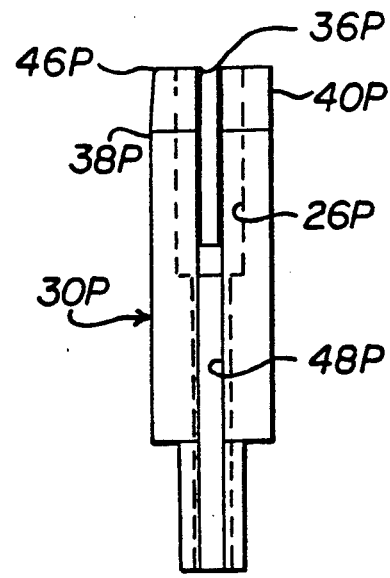
FIG. 3 is a side elevation view of the chuck of the prior art probe of FIG. 2.

As indicated in FIGS. 3 and 4, the chuck has four slots 36P forming resilient fingers 38P. In addition, the front end of the chuck has a tapered exterior surface 40P. When the nut is tightened, a tapered nut surface 42P squeezes the chuck fingers 38P together to tightly grip the probe tip 12 between them. The body 16P and nut 14P are generally formed of a nonconductive material such as plastic for safety purposes and to reduce cost.

The cost of cutting the slots 36P is substantial. If the outer corners 44P of the slots are not deburred and rounded, then as the nut is tightened the inside surface of the nut that rotates against the fingers while pressing firmly against them, is scratched and scored. This reduces reliability and increases the torque required to fully tighten the nut. The torque required to fully tighten the nut is also increased by the fact that some force is required to bend the tip-gripping fingers 38P even if no probe tip is present. When the nut is tightened, a corner 46P at the front end of the chuck can cut into the interior nut surface 42P. This not only increases torque, but can cause the chuck and wire 20 to turn, which can break the joint between them. To prevent this, a keyway 48P was formed in the chuck, to receive a corresponding key formed in the body, which increased the cost.

Figure 5:
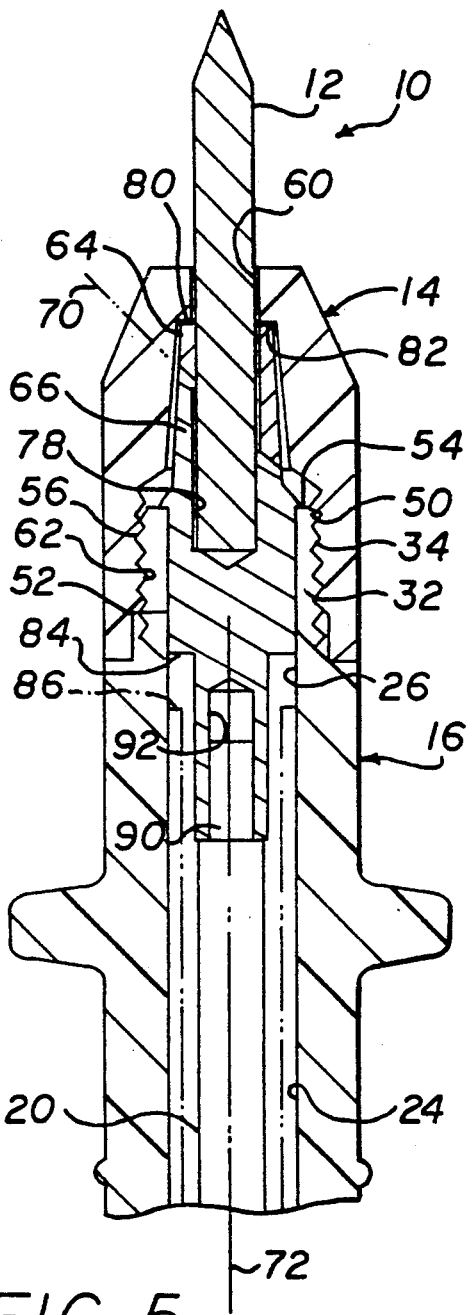
FIG. 5 is a sectional side view of a test probe constructed in accordance with the present invention.

FIG. 5 illustrates details of the test probe of the present invention which overcomes some of the disadvantages of the illustrated prior art probe. The test probe body 16 and nut 14 of the present invention can be constructed identically to the prior art body 16P and nut 14P, although they function somewhat differently. The body has a wire-passing hole 24 for passing the wire 20. The front end 50 of the body has walls 32 forming a chuck-holding recess 26 for holding the rear portion of a chuck 52. The walls 32 of the body recess have an external thread 34. The extreme front end of the body forms a largely forwardly-facing body shoulder 54 which can abut an abutment 56 formed on the chuck to limit rearward movement of the chuck. The nut 14 has a tip-passing hole 60 and has internal threads 62 that threadably engage the body threads 34.

Figure 6:
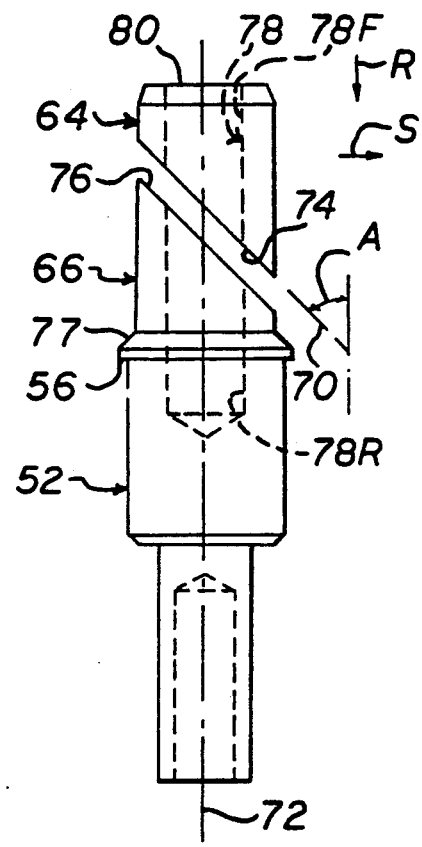
FIG. 6 is a side elevational view of the chuck of the probe of FIG. 5, with the front and rear chuck parts being slightly separated.
Figure 7:
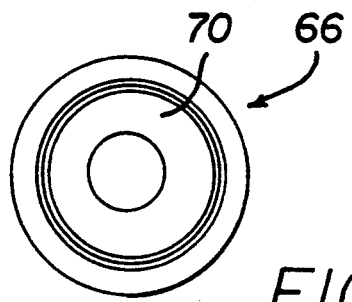
FIG. 7 is a front elevation view of the chuck of FIG. 6.
Figure 8:
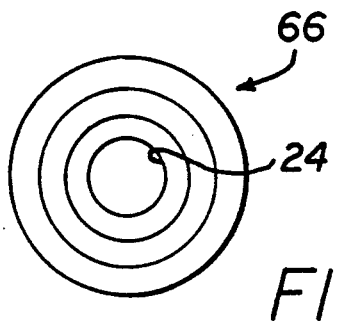
FIG. 8 is a rear elevation view of the chuck of FIG. 6.

As shown in FIG. 6, the chuck 52 includes front and rear parts 64, 66 that are separate parts, as though an original one-piece chuck were split along an imaginary plane 70 extending at an angle A with the axis 72 of the rear chuck part. The split results in surfaces 74, 76 on the front and rear parts that abut one another, with the surfaces being smooth so the front part can slide on the rear part. The rear chuck part has an outwardly-extending flange 77 forming the abutment 56.

The chuck has a forwardly-opening probe-tip holding hole 78 with portions 78F and 78R lying in both the forward and rearward chuck parts. When a probe lies in the hole and a rearward force is applied to the shoulder 80 at the front end of the front chuck part, the front chuck part slides along the split plane 70. Such sliding results in rearward movement in the direction R and also sideward movement in the direction S. The sideward component of movement of the front chuck part results in the probe tip being trapped by shear forces between the two chuck parts, with the forces against the probe tip resulting in friction holding the probe tip in place.

Referring again to FIG. 5, it can be seen that the nut has a largely rearwardly-facing shoulder 82 that presses rearwardly against the shoulder 80 on the front chuck part as the nut is tightened. As described above, such rearward force against the front chuck part results in movement of the chuck front part with a sideward directional component that causes it to trap the probe tip 12 between the front and rear chuck parts 64, 66. The rearward force on the rear chuck part is resisted by force of the abutment 56 of the rear chuck part against the body shoulder 54. It would be possible to instead rely upon a rear shoulder 84 of the chuck abutting a bottom 86 of the chuck recess. However, this would require a smaller wire-passing hole that could not pass a larger diameter wire. Also, contact between the rear shoulder 84 of the chuck and the bottom of the chuck recess would occur at a small radius from the axis 72, which would result in less torque to resist turning of the chuck rear part that is obtained from the large diameter flange shoulder 56.

Referring to FIG. 6, it can be seen that the split plane 70 between the front and rear chuck parts extends at an angle A with respect to the chuck axis. The angle A should be a plurality of degrees less than 90°, such as less than 80°, to assure that the front chuck part will slide on the rear chuck part and not be prevented from sliding by friction between the sliding surfaces. On the other hand, the angle A should be a plurality of degrees to assure that there is substantial sideward movement as the upper chuck part moves rearwardly. An angle A of about 45° (i.e. between 30° and 60°) provides a good compromise. The chuck parts can be formed as illustrated, by cutting a one-piece chuck along the plane 70 or forming the parts as though from such a cutting. However, it is only necessary that the two chuck parts have abutting sliding surfaces extending at an angle A from the chuck axis. Forming two chuck parts with such sliding surfaces can be accomplished at a lower cost than the prior art requirement of forming slits in a chuck to obtain fingers.

The test probe can be assembled by projecting the wire 20 (FIG. 5) completely through the test probe, with a projecting wire conductor 90 inserted into a hole 92 at a reduced-diameter rearward end of the chuck, and with the conductor crimped and/or soldered or otherwise joined to the chuck. The wire is then moved rearwardly until the rear chuck part 66 is in the position shown and any wire strain relief is applied. The probe tip 12 is inserted into the rear chuck part 66, the front chuck part 64 is placed around the probe tip, and the nut 14 is placed around the tip. The nut 14 is then turned to press the front chuck part 64 rearwardly so it slides with a sideward directional component to trap the probe tip in place.

Figure 9:
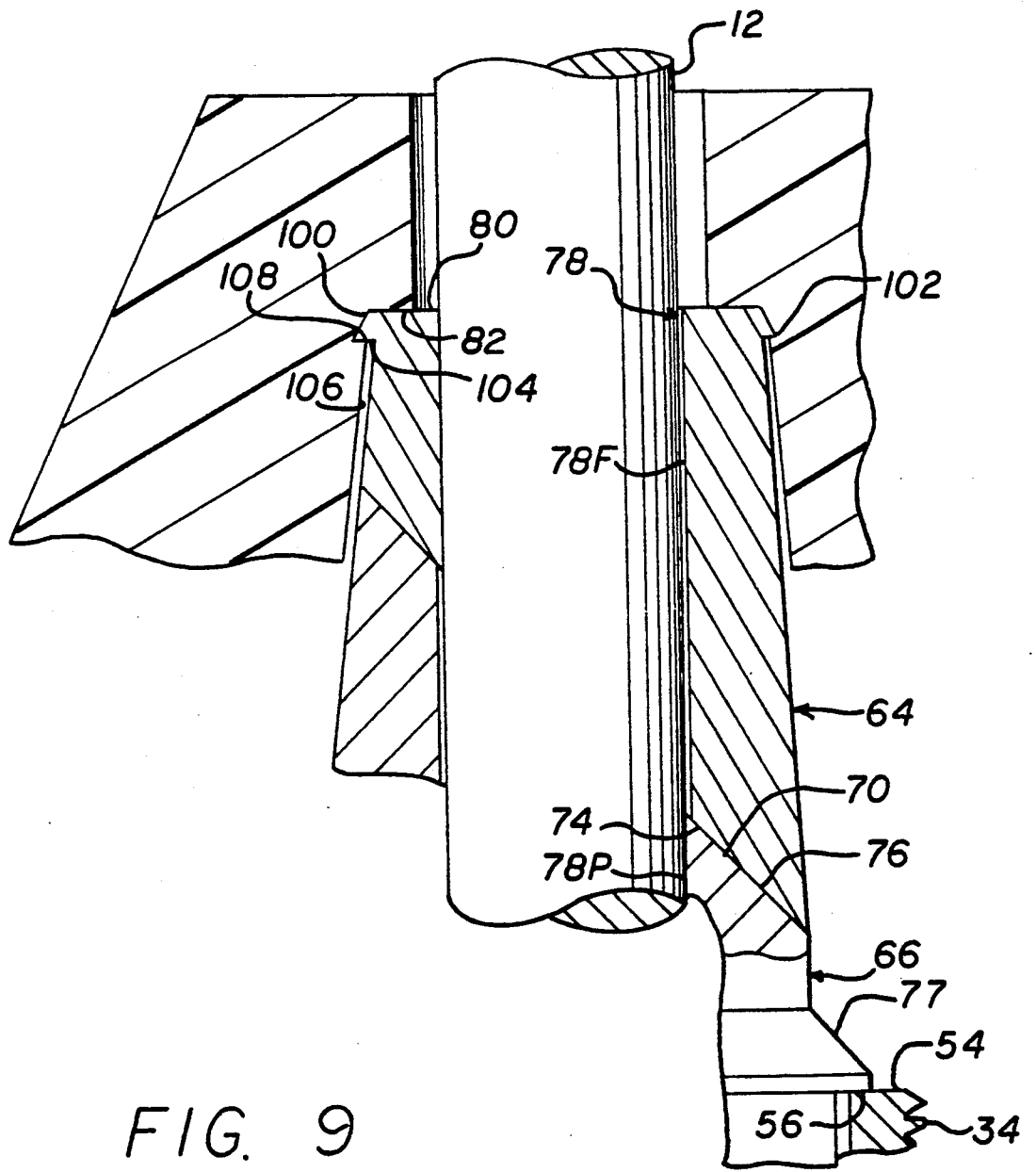
FIG. 9 is an enlarged view of a portion of the test probe of FIG. 5.

Although it is only necessary to loosen the nut 14 to replace a probe tip 12, technicians sometimes completely remove the nut. This could allow the small front chuck part 64 to fall on the floor and become lost. To prevent this, applicant forms an outwardly-extending ring-shaped flange 100 (FIG. 9) on the front chuck part. The flange 100 has a barb-like cross section with a pointed outer edge 102 and a rear shoulder 104. The front chuck part is initially captured in the plastic nut 14 by pressing the nut firmly rearwardly, until the pointed edge 102 "bites" into the walls 106 of the nut hole, so the rear shoulder 104 abuts a corresponding abutment 108 formed in the nut. The installation can be achieved by merely tightening the nut with the chuck parts in place.

Applicant has constructed and tested the test probe, with the body and nut formed of Nylon and the chuck formed of brass. Applicant found that the front chuck part 64 reliably remained captured in the nut when the nut was removed, and the chuck operated well in retaining a probe tip and allowing it to be easily replaced. The nut rotated relative to the front chuck part with little friction between them. No keyway was required to prevent rotation of the chuck relative to the body when the nut was turned.

Thus, the invention provides an electrical test probe with replaceable tip, which is durable and can be constructed at low cost. The probe includes a chuck that fits into a recess at the front of a probe body and a nut that screws onto the body around the chuck. The chuck has front and rear parts that each includes part of a probe tip-holding hole. The chuck parts are split with adjacent surfaces extending substantially parallel to an imaginary plane that extends at an angle of a plurality of degrees from the axis of the chuck, but a plurality of degrees less than 90° from the axis. As the nut is tightened, the nut presses rearwardly against the front chuck part to cause it to slide both sidewardly and rearwardly so the probe tip is trapped between the chuck parts and thereby held in place. The rearward chuck part can be supported against rearward movement with respect to the probe body, by forming an outwardly extending flange on the rear chuck part, which abuts a generally forwardly-facing shoulder on the body. The front chuck part can be retained in the nut by forming the front chuck part with an outwardly-extending ring-shaped, barb-like flange that "bites" into the inside walls of the nut.

Although particular embodiments of the invention have been described and illustrated herein, it is recognized that modifications and variations may readily occur to those skilled in the art, and consequently it is intended that the claims be interpreted to cover such modifications and equivalents.

I claim:

1. An electrical test probe with replaceable tip comprising:
   an elongated test probe body having a wire-passing hole and having a front end portion with walls forming a chuck holding recess communicating with said hole, said body forming an at least partially forward-facing shoulder, and said walls having threads;
   a chuck with at least a rear end lying in said recess and with an abutment that can abut said shoulder, said chuck having an axis and having a forwardly-opening tip holding chuck hole;
   a nut with a tip passing hole, said nut threadably engaged with said body threads and having a shoulder that presses rearwardly against said chuck;
   said chuck has separate front and rear parts that each includes part of said tip holding chuck hole, said parts having adjacent surfaces with at least one of them extending substantially parallel to an imaginary plane that extends at an angle of a plurality of degrees from said axis but a plurality of degrees less than 90° from said axis, said front part sliding along said plane as said nut is tightened so a probe tip in said chuck hole is trapped between said chuck parts.
2. The test probe described in claim 1 wherein:
   said angle is about 45°.
3. The test probe described in claim 1 wherein:
   said body has an extreme front end forming said shoulder on said body;
   said rear part of said chuck has an outwardly-extending flange forming said abutment that lies against said body shoulder.
4. The test probe described in claim 1 wherein:
   said nut has inside walls that closely surround said front part of said chuck, and said front part has an outwardly-extending, ring-shaped, barb-like flange that projects into said nut inside walls to retain said front part in said nut when said nut is removed from said body.

5. An electrical test probe with replaceable tip comprising:
   an elongated test probe body having rearward and forward portions and having a hole extending along its length, said hole having a forward end with recess walls forming a chuck-holding recess, said recess walls having an external thread;
   a chuck having an axis and a probe-holding hole substantially on said axis, said chuck having forward and rearward parts with said rearward part lying in said recess and having a largely rearwardly-facing abutment that abuts said body and with said forward part having a front end, said forward and rearward parts being separate parts with adjacent surfaces substantially parallel to an imaginary plane that is normal to a line extending at an angle of between 10° and 80° from said axis;
   a nut which has a hole that is substantially aligned with said chuck hole, an internally threaded rear portion that is engaged with said body threads, and a largely rearwardly-facing shoulder that abuts said chuck front end.
6. The test probe described in claim 4 wherein:
   said chuck rear part has a flange on its outside forming said abutment, and said abutment abuts the extreme front end of said body.
7. The test probe described in claim 4 including:
   a wire extending through said body hole and connected to said chuck rear part;
   a tip lying in said chuck hole;
   said nut being of insulative polymer material and being tightened on said body threads with said tip being squeezed between said chuck parts.
8. The test probe described in claim 5 wherein:
   said nut has inside walls that closely surround said front part of said chuck, and said front part has an outwardly-extending, ring-shaped, barb-like flange that projects into said nut inside walls to retain said front part in said nut when said nut is removed from said body.

* * * * *